Sept. 21, 1965 A. J. WOLTERMAN 3,207,918

LOGIC CIRCUITS

Filed May 3, 1961 2 Sheets-Sheet 1

INVENTOR
ARDEN J. WOLTERMAN
BY Paul D. Carmichael
ATTORNEY

United States Patent Office 3,207,918
Patented Sept. 21, 1965

3,207,918
LOGIC CIRCUITS

Arden J. Wolterman, Apalachin, N.Y., assignor to International Business Machines Corporation, New York, N.Y., a corporation of New York Filed May 3, 1961, Ser. No. 107,460
3 Claims. (Cl. 307—88.5)

The present invention relates generally to the electronic arts and more particularly to logic circuits for use in high speed computers or the like.

The logic circuits described herein make use of a particular semiconductor device having a negative resistance region in its characteristic curve wherein a quantum mechanical tunneling principle is involved in providing the negative resistance region. Such a semiconductor device is known in the art as a tunnel diode in reference to the tunneling principle or an Esaki diode (see, for example, the article by L. Esaki, entitled "New Phenomenon in Narrow Germanium p-n Junction," Physical Review, volume 109, pages 603 and 604, January 15, 1958). However, it should be understood at the outset, that the invention, in its broader aspects is applicable to logic circuits employing other bistable or polystable devices characterized by negative resistance regions in their characteristic curves and actuatable or settable in response to electrical stimulation.

One type of logic circuit which has been previously developed comprises a tunnel diode connected in series with a bias resistor. The end terminal of the bias resistor is connected to a positive terminal of a direct current voltage source and the end terminal of the tunnel diode is referenced to ground. The tunnel diode is initially biased at a low voltage state as determined by the value of the bias resistor and appears as a relatively low impedance circuit element. Input signals are supplied to the junction between the bias resistor and the tunnel diode. This junction is commonly termed the node of the logic circuit and output signals are also coupled from this node. It is usual to apply a plurality of input signals to the node and/or to take a plurality of output signals from the node as is required in any given application. The input and output conductors essentially fan into and away from the common node of the logic circuit. A more complete description of such tunnel diode logic circuits is contained in an article by W. F. Chow, entitled, "Tunnel Diode Digital Circuitry," IRE Transactions on Electronic Computers, pages 295–301, September 1960.

When the above-described tunnel diode logic circuit is employed to perform the logical And function (Boolean multiplication), all of the input signals must be applied or must be at a positive value before the operating point of the tunnel diode is raised over the peak value on its characteristic curve. The tunnel diode switches through the negative resistance region at an extremely fast rate and appropriate changes are observed on the output conductor or conductors.

This arrangement is well known in the art but is subject to several severe limitations. A first, and perhaps the most important, limitation is that only a very small number of input signals can be combined in performing the logical And function. This is because the peak value on the characteristic curve of the tunnel diode cannot be exceeded by any combination of the various inputs supplied thereto other than when all input signals are at a positive level simultaneously. A second limitation is that the logic circuit is adversely affected by transients in any of the input signals. Several of the input signals may be at the positive level at any particular instant of time whereby the operating point of the tunnel diode is near the peak value on its characteristic curve.

A relatively small transient in any of the input signals will switch the tunnel diode even though all of the input signals have not been applied or are not at a positive level. Another limitation is that expensive and precision tunnel diodes characterized by large and stable peak values are required since the tunnel diodes are normally operating near the peaks of their characteristic curves. The effect of all of the above has been to prevent the use of such tunnel diode logic circuits in applications where the same might otherwise be advantageously employed.

Commonly, each input and output conductor of a tunnel diode logic circuit couples the node thereof to the node of an adjacent logic circuit in a logic chain. Certain logic chains are operated synchronously to insure the directional transmission of data therethrough. Three or more clock pulses are employed for the successive stages of a logic chain with the information being transmitted during overlapping of the clock pulses. Such a logic chain is said to operate synchronously in that information is propagated through the various stages in a clocked or synchronous manner. Synchronous systems are ideally adapted for certain types of logical operations but asynchronous systems operating in response to a drive signal or the input signals themselves offer advantages when performing other operations as, for example, when combining a large number of input signals to define a logical And function.

Briefly, the present invention relates to logic circuits and particularly to a logic circuit for performing the logical And function wherein each of the stages thereof comprises a bias resistor and a tunnel diode connected in series. The end terminal of the bias resistor is connected to or coupled with an input signal while the end terminal of the tunnel diode is referenced to ground. The nodes of the adjacent stages of the And circuit are interconnected by coupling devices, such as capacitors. A drive signal is supplied to the node of the first stage while an output signal is taken from the node of the last stage of the logical And circuit. The tunnel diode for each stage is initially at its low voltage state when only the input signal is supplied thereto or is at a positive level. The tunnel diode will switch when the input signal associated therewith and the drive signal are both present or at positive levels. A change is observed on the output conductor only after all of the tunnel diodes have switched in response to the presence of the drive signal and all input signals. The And logic circuit is adapted to be employed in either a monostable or a bistable fashion as is best adapted for the intended use.

A logical Or circuit comprising stages similar to the stages used in the logical And circuit is also described. The logical And and Or circuits are combined in a logic chain or system whereby an indication as to whether an even or an odd number of a number of input signals have been applied or are at their positive levels is provided.

It is the primary or ultimate object of the present invention to provide improved logic circuits employing bistable or polystable devices characterized by negative resistance regions in their characteristic curves and actuatable or settable in response to electrical stimulation.

Another object of the invention is to provide improved tunnel diode logic circuits wherein an infinite number of input signals can be combined in performing logical And functions. These logic circuits are not limited to any particular number of input signals.

Another object of the invention is to provide tunnel diode logic circuits for performing logical And functions which are not adversely affected by transients and wherein expensive and precision tunnel diodes are not required.

Yet another object of the invention is to provide improved tunnel diode logic circuits for performing logical And functions which are capable of operating either in a monostable or a bistable mode. When operating in the monostable mode the logic circuits are automatically reset in preparation for the succeeding logic operation, while when operating in the bistable mode the circuits are forcibly reset by removing the input and drive signals or causing the same to go to the down level between successive logic operations. Each of these modes is adapted for particular applications whereby the logic circuits disclosed herein are highly versatile.

A further object of the invention is to provide improved tunnel diode logic circuits which operate asynchronously and which are adapted to be combined with synchronous logic systems. The input signals to the logic circuits may comprise the output signals of a synchronous logic system and the output signals from the logic circuits may be used as input signals to other synchronous logic systems.

A further object of the invention is to provide improved tunnel diode logical circuits for performing Boolean addition or logical Or functions.

A still further object of the invention is to provide improved logic circuits for providing an indication as to whether an odd or an even number of input signals are being applied or are at an up level at a particular instant in time. These circuits are constructed by combining the logical And and Or circuits in a manner to be further explained.

A more particular object of the invention is to provide logic circuits of the type above described characterized by their high speed operation, ruggedness with respect to environmental conditions and relative simplicity.

The foregoing and other objects, features and advantages of the invention will be apparent from the following more particular description of preferred embodiments of the invention as illustrated in the accompanying drawings.

Figure 1:
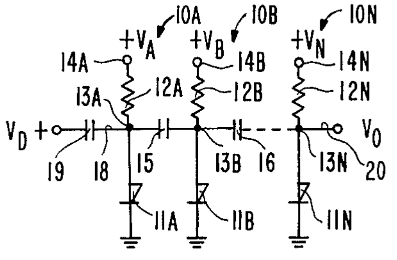
FIGURE 1 is a schematic circuit diagram of a logical And circuit wherein the tunnel diodes are biased for operation in a bistable mode constructed in accordance with the teachings of the present invention.
Figure 2:
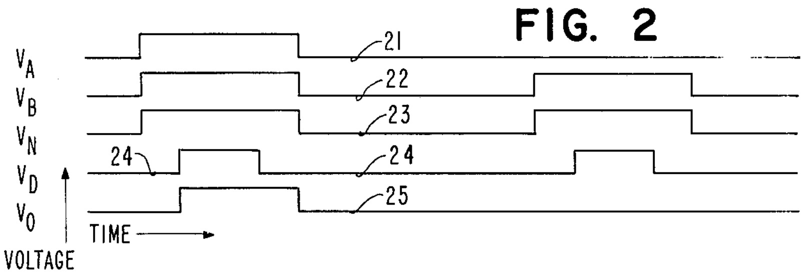
FIGURE 2 is a graphical illustration of the general variation with time of the input and various other signals in the circuit of FIGURE 1.
Figure 3:
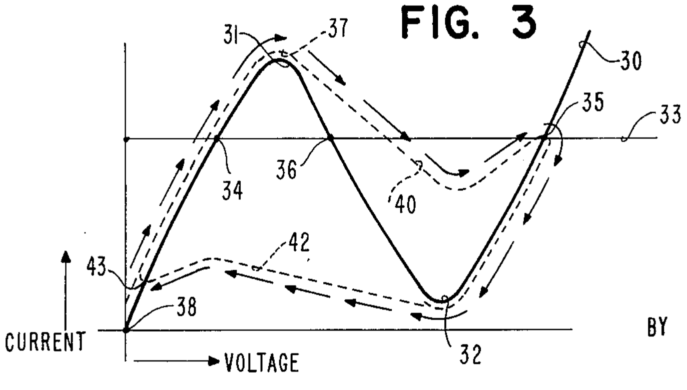
FIGURE 3 is a graphical representation of the characteristics of one of the tunnel diodes in FIGURE 1 and showing the operation thereof.

Referring now to the drawings, and initially to FIGURES 1–3 thereof, there is shown a logic circuit embodying the teachings of the present invention. This logic circuit comprises a plurality of stages indicated generally by the reference indicia 10A, 10B and 10N. The logic circuit is adapted to combine any number of input signals in performing a logical And function and each input signal has a stage of the logic circuit associated therewith. For example, the input signal $V_A$ is associated with the stage 10A, the input signal $V_B$ with the stage 10B and the input signal $V_N$ with the stage 10N.

The letter N following a reference numeral is intended to designate the last stage of the logic circuit where mathematically N would represent any whole integer. For example, if ten input signals were being combined to perform Boolean multiplication, the logic circuit would comprise ten stages with one of the input signals associated with each of the stages. The stages of the logic circuit are generally similar and to facilitate description, the same reference numerals followed by an appropriate letter will be used to designate like component parts in the various stages.

Each of the stages of the logic circuit comprises a tunnel diode 11A, 11B or 11N having a negative resistance region in its characteristic curve which is connected in series with a bias resistor 12A, 12B or 12N. The common junction between the resistor and the tunnel diode defines a node of the stage 13A, 13B or 13N. The end terminal of the tunnel diode is referenced to ground while the end terminal 14A, 14B or 14N of the bias resistor is connected or coupled with an input signal. In the present instance the input signal takes the form of a direct current voltage indicated by the reference indicia $V_A$, $V_B$ or $V_N$.

The node of each intermediate stage of the logic circuit is connected or coupled with the nodes of the adjacent stages. Node 13A of stage 10A is connected to node 13B of stage 10B by a coupling capacitor 15 and, in a similar manner, node 13B of stage 10B is connected to node 13N of stage 10N by coupling capacitor 16. The node of the first stage of the logic circuit is also coupled with a source of drive signals while an output signal is taken from the node of the last stage. The node 13A of stage 10A is connected by conductor 18 and coupling capacitor 19 with a drive signal $V_D$. An output signal $V_O$ is taken from the node of the last stage 10N over conductor 20.

FIGURE 2 illustrates graphically the various signals applied to and taken from the logic circuit of FIGURE 1 with respect to time. Line 21 shows the potential $V_A$ applied to the input terminal 14A of stages 10A. In a similar manner, the lines 22 and 23 represent the voltage signals $V_B$ and $V_N$ which are applied to the input terminals 14B and 14N of stages 10B and 10N. The drive signal $V_D$ which is connected to the node 13A of stage 10A is represented by line 24 while line 25 indicates the resultant output signal $V_O$ observed on conductor 20. It will be noted that when all input signals are at a positive level and the drive signal is also at a positive level, a positive pulse will appear on the output conductor 20. However, if any of the input signals are missing, as for example, $V_A$, no output pulse will appear on the output conductor even though the drive signal and all other input signals are present. The graph of the output signal $V_O$ is only a general representation of the waveform observed on the conductor 20 since the output signal will vary in accordance with the operation of the tunnel diode 11N and the input to this tunnel diode is not isolated from the output thereof.

In FIGURE 3 of the drawings the curve 30 represents the current-voltage characteristic of the tunnel diode 11A of stage 10A. The curve 30 is a typical tunnel diode characteristic curve and includes a positive resistance region between the origin 38 and the point or peak 31, a negative resistance region between points 31 and 32 and a positive resistance region to the right of point or valley 32. A load line 33 is also indicated in this figure of the drawings. This load line is substantially a straight line (constant current). The bias resistor 12A is of a relatively high value whereby the node 13A essentially sees a constant current source of a value equal to the vertical coordinate of the load line 33 when the input signal $V_A$ is at the positive level. The load line 33 intersects the characteristic curve 30 of the tunnel diode 11A at points 34 and 35 in the positive resistance regions thereof between the origin 38 and the peak or point 31 and to the right of point or valley 32 of the curve. The points 34 and 35 define stable operating points for the tunnel diode when the input signal $V_A$ is at a positive value. The tunnel diode 11A thus has two stable operating points 34 and 35 in its positive resistance regions which are disposed on opposite sides of its negative resistance region. It is noted that the load line 33 also intersects the curve 30 at point 36 in the negative resistance region thereof. However, point 36 is unstable and when the operating point of the tunnel diode is raised over the peak 31, the diode will immediately switch and stabilize at the second stable or high voltage operating point 35.

Superimposed upon the characteristic curve 30 of the tunnel diode 11A and the load line 33 is a curve 37 which depicts the current-voltage relationship at the node 13A during an operational cycle of the stage 10A. The curve 37 is shown by broken lines disposed in spaced relation with respect to the curve 30 for clarity of presentation.

will be assumed that initially no input or drive signals are applied to the various stages and that the entire logic circuit is at rest. At this time the operating point Considering now the operation of the logic circuit, it of the tunnel diode 11A will be at the origin 38 of the curve 30. When the input signal $V_A$ is applied to the input terminal 14A, the operating point of the tunnel diode 11A will rise to the first stable operating point 34 as defined by the intersection of the load line 33 and the positive resistance region of curve 30 to the left of point or peak 31. The tunnel diode 11A is operating at a low voltage state which is stable. It will also be assumed that at this time the input signals $V_B$ and $V_N$ are present whereby the tunnel diodes 11B and 11N are at their low voltage stable states. The tunnel diodes 11A, 11B and 11N appear as relatively low impedance circuit elements with relatively small voltage drops taking place thereacross.

When the drive signal $V_D$ becomes positive, the operating point of the tunnel diode 11A is raised above the peak 31 on the characteristic curve 30. The tunnel diode 11A imediately switches through the negative resistance region between points 31 and 32 to the second stable or high voltage operating point 35 with the voltage and current at the node 13A varying in accordance with the portion 40 of the curve 37 lying between the points 31 and 35. The dip or valley in the portion 40 of the curve 37 is due to the flow of energy through the coupling capacitor 15 to the node 13B and through the tunnel diode 11B of the second stage 10B. The tunnel diode 11B is in its low voltage state and appears at this time as a low impedance circuit element. The portion 40 of the curve 37 drops below the load line 33 and eventually sufficient electrical energy is coupled to the node 13B of the second stage 10B whereby the tunnel diode 11B is switched. The electrical energy required to switch the tunnel diode 11B is defined by the distance from the load line 33 to the bottom of the dip or valley in the portion 40 of the curve 37. The voltage and current at the node 13A rise to the point 35 and the tunnel diode 11A is set at its high voltage and second state 35.

The tunnel diode 11A is switched to its high voltage state or operating point 35 when the drive signal $V_D$ and the input signal $V_A$ are applied or are at positive levels simultaneously. Switching of the tunnel diode 11A causes the flow of electrical energy through the coupling capacitor 15 to the second stage and the tunnel diode 11B is caused to switch providing, of course, that the input signal $V_B$ is present or at a positive level. The switching of the tunnel diodes in the stages of the logic circuit continues in a successive or rippling manner until the tunnel diode 11N associated with the last stage is switched. Switching of the tunnel diode 11N causes a positive signal $V_O$ to appear on the output conductor 20. The duration of the positive pulse of the output signal $V_O$ is dependent upon the length of time that the tunnel diode 11N remains at its second or high voltage resistance state.

To obtain an output signal on the conductor 20 all of the input signals must be present during the time the drive signal $V_D$ is applied to the first stage and is propagated through the remaining stages of the logic circuit. If, for example, the input signal $V_A$ is not at a positive level at the time when the drive signal $V_D$ is applied, the voltage and current at the node 13A will not be sufficient to raise the operating point of the tunnel diode 11A above the peak value 31 and this element will not switch.

The coupling capacitors 15 and 16 are operative to block the flow of electrical energy between successive stages of the logic circuit when the tunnel diodes thereof are at stable operating points. However, these capacitors are operative to transfer energy between the successive stages of the logic circuit when the tunnel diodes associated therewith are switching through their negative resistance regions. Capacitors are not the only coupling means which may be employed since other circuit elements, such as properly selected backward diodes, may be employed for the above purposes.

A positive signal $V_O$ appears on the output conductor 20 as long as the tunnel diode 11N is set in its second or high voltage state. To reset the various stages of the logic circuit the input ignals $V_A$, $V_B$ and $V_N$ and the drive signal $V_D$ are removed or go to the down level. The voltage and current at the node 13A is not sufficient to sustain the tunnel diode 11A at its second or high voltage stable state and the operating point of the tunnel diode 11A falls along the characteristic curve 30 from point 35 to point 32. When the valley 32 of the characteristic curve 30 is reached, the tunnel diode 11A switches through its negative resistance region and the node 13A follows a portion 42 of the curve 37 until a point 43 on the first positive resistance portion of the curve is reached. If the drive signal has been removed or is at the down level at this time, the operating point of the tunnel diode 11A will fall to the origin 38 of the characteristic curve 30. When the input signal $V_A$ again goes to the up level, the operating point of the tunnel diode will rise to point 34 and this element will again be set in its first and low voltage state prior to the application of a subsequent drive signal. Each of the tunnel diodes in the various stages of the logical And circuit will be reset in a similar manner whereby the logic circuit is prepared for the subsequent application of the drive and input signals.

The tunnel diodes 11A, 11B and 11N are each shown to have a pair of stable states due to the constant current load lines defined by the bias resistors 12A, 12B and 12N and the input signals $V_A$, $V_B$ and $V_N$. The logic circuit operates in a bistable mode since each of the tunnel diodes 11A, 11B or 11N has a pair of stable operating points associated therewith. It is necessary to reset the tunnel diodes from their high voltage operating states by removing the input and drive signals between successive logic operations.

Figure 4:
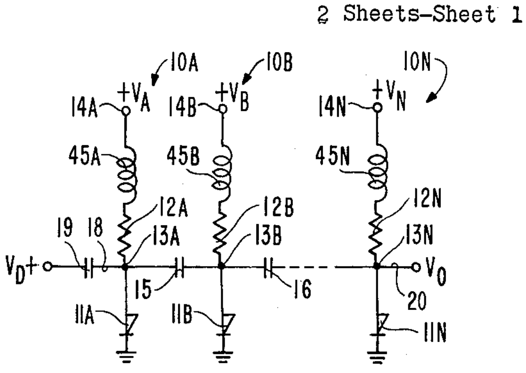
FIGURE 4 is a schematic circuit diagram of a logical And circuit wherein the tunnel diodes are biased for operation in a monostable mode.
Figure 5:
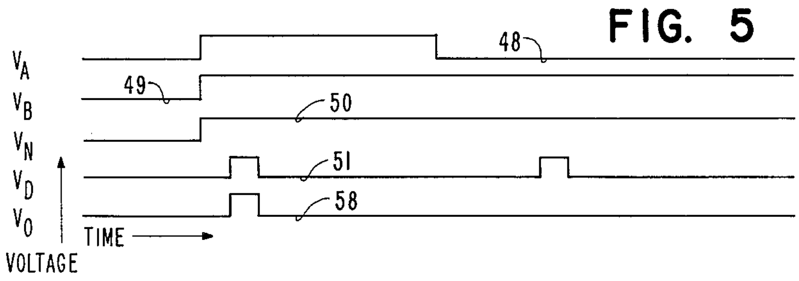
FIGURE 5 is a graphical illustration of the general variation with time of the input and various other signals in the circuit of FIGURE 4.
Figure 6:
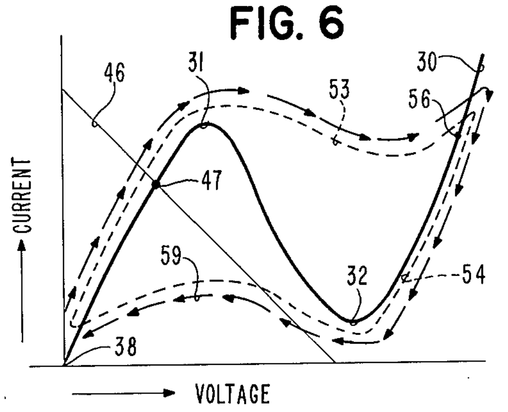
FIGURE 6 is a graphical representation of the characteristics of one of the tunnel diodes in FIGURE 4 and showing the operation thereof.

In FIGURES 4–6 of the drawings there is shown a second embodiment of the invention wherein the tunnel diodes of a logical And circuit are biased for monostable operation. As will be hereinafter more fully described, the various stages of the logic circuit are automatically reset without the necessity of removing the input signals between successive logic operations. This embodiment is generally similar to the embodiment previously described and, to avoid repetition in the specification, the same reference indicia are used to designate like component parts.

Each of the stages of the logical And circuit has an inductor 45A, 45B or 45N connected in series with the bias resistor 12A, 12B or 12N and the tunnel diode 11A, 11B or 11N. The inductor associated with each stage has an inductance value which is larger than the inherent inductance of the circuit path connected in parallel with the tunnel diode of that stage. For example, the inductance value of inductor 45A is larger than the inductance of the circuit path defined by coupling capacitor 15 and tunnel diode 11B connected in parallel with the tunnel diode 11A.

Each of the load resistors 12A, 12B or 12N is selected to provide a load line 46 when the associated input signal $V_A$, $V_B$ or $V_N$ is applied. The load line 46 for stage 10A of the logic circuit crosses the characteristic curve 30 of the tunnel diode at a point 47 which lies in the positive resistance region between the origin 38 and the peak 31. The load line 46 intersects the characteristic curve 30 at one and only one point whereby the tunnel diode 11A has only one stable operating point as distinguished from the tunnel diode 11A in the first embodiment of the invention which is provided with two stable operating points by the constant current load line 33. The tunnel diodes 11B and 11N of the logical And circuit are biased in a similar manner whereby they each have only one stable low voltage state.

Considering now the operation of this embodiment of the invention, it will be assumed that initially all of the input signals $V_A$, $V_B$ and $V_N$ are applied or are at the up level as indicated by lines 48, 49 and 50 in FIGURE 5 of the drawings. At this time each of the tunnel diodes 11A, 11B or 11N will be operating at the stable or low voltage point 47 with the capacitors 15 and 16 blocking the transfer of electrical energy between the adjacent stages. The tunnel diodes appear as relatively low impedance circuit elements since they are operating at stable points on the low voltage portion of their characteristic curves.

When the drive signal $V_D$ in the form of a positive pulse is applied as indicated by the line 51 in FIGURE 5 of the drawings, the operating point of the tunnel diode 11A is raised above the peak 31 on its characteristic curve 30 and the tunnel diode 11A immediately switches through its negative resistance region to the positive resistance region to the right of the valley 32. The voltage and current of the node 13A follows a portion 53 of a curve 54 and a dip or valley is observed in this portion of the curve. This dip or valley is due to the flow of energy through the coupling capacitor 15 and the tunnel diode 11B in the second stage. The flow of energy causes the tunnel diode 11B to switch through its negative resistance region. With the switching of the tunnel diode 11B, the operating point of the node 13A rises to a point 56 on the positive portion of the characteristic curve 30 which is to the right of valley 32. The tunnel diodes 11A, 11B and 11N are switched in a successive manner due to the presence of all of the input signals $V_A$, $V_B$ and $V_N$ whereby an output signal $V_O$, as represented by the line 58 in FIGURE 5 of the drawings, is evidenced on the output conductor 20.

The point 56 on the curve 30 is unstable and the operating point of tunnel diode 11A and the voltage and current at node 13A begin to fall toward the valley 32 at a rate determined by the value of the inductor 45A. As soon as the valley 32 is reached, the tunnel diode 11A will immediately switch through its negative resistance region and the node 13A follows a portion 59 of the curve 54 to the first positive resistance region of the characteristic curve 30. The peak in the portion 59 of curve 54 represents the transfer of energy from the tunnel diode 11B in the second stage of the logic circuit through the coupling capacitor 15 and the tunnel diode 11A. By properly selecting circuit parameters, sufficient energy is removed from the node 13B of the second stage whereby the tunnel diode 11B is caused to switch through its negative resistance region. In this manner the successive stages of the logic circuit may be reset automatically with the reset function being propagated from stage to stage.

The output signal $V_O$ is at a positive level as long as the tunnel diode 11N of stage 10N is operating on the second positive resistance region of its characteristic curve. In the illustrated embodiment the output $V_O$ is shown to go to the down level when or shortly after the drive pulse or signal is removed. It is possible to delay the end of the output pulse with respect to the end of the drive signal by proper selection of the inductors 45A, 45B or 45C in relation to the other circuit parameters. This is because the inductor controls the rate at which the operating point of the tunnel diode falls along the positive resistance region to the right of the negative resistance region on the characteristic curve.

In the event that any input signal is not applied or is not at a positive level when the drive signal $V_D$ is applied, the tunnel diode of the stage associated with such input signal will not switch through its negative resistance region since the operating point will not be raised above the peak. The drive signal will not be propagated through this stage and the tunnel diodes of the remaining stages of the logic circuit will not switch. No output signal will be observed on the conductor 20 as is indicated in the right hand portion of FIGURE 5 of the drawings.

The above-described logic circuits are not limited to any particular number of input signals. An infinite number of input signals can be combined to perform a logical function by providing a separate stage for each of the input signals. The tunnel diodes of the various stages operate at points well below the peaks of their characteristic curves until the drive signal and input signals are applied. This arrangement provides a very stable logic circuit in that the same is not adversely affected by transients in the input or drive signals. Also, expensive and precision circuit components are not required. The logic circuits are adapted to be operated in either bistable or monostable modes as is best suited for any particular application.

Figure 7:
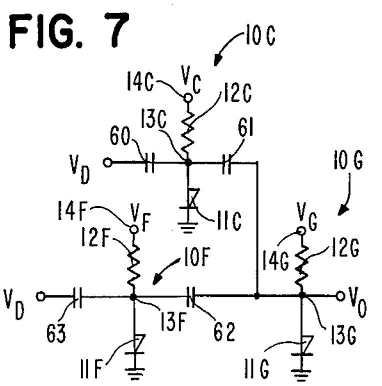
FIGURE 7 is a schematic circuit diagram of a logical Or circuit employing tunnel diodes.

Referring now to FIGURE 7 of the drawings, there is shown a logic circuit for combining input signals to perform Boolean addition or the logical Or function. This logic circuit comprises the stages 10C, 10F and 10G with each stage having a tunnel diode 11C, 11F or 11G connected in series with a bias resistor 12C, 12F or 12G. The input terminal 14C of the stage 10C is connected with the input signal $V_C$ while the input terminal 14F of the stage 10F is energized by the input signal $V_F$. In a similar manner, the end terminal 14G of stage 10G is connected to a positive terminal of a direct current voltage source $V_G$. The voltage signals $V_C$ and $V_F$ are input signals which are adapted to be applied or to be at their up levels at various times while the voltage source $V_G$ applies a positive voltage to the terminal 14G at all times during a logical operation.

The node 13C of the stage 10C is connected through capacitor 60 with the drive signal $V_D$ and through coupling capacitor 61 to the node 13G of the stage 10G. Stage 10F is interconnected with stage 10G by means of a coupling capacitor 62 disposed between the nodes 13F and 13G while the drive signal $V_D$ is coupled to the node 13F by capacitor 63. It will be noted that the stages 10C and 10F associated with the input signals $V_C$ and $V_F$ are both connected to the node 13G of the output stage 10G by the coupling capacitors 61 and 62, respectively. An output signal $V_O$ is taken from the node 13G of the stage 10G.

When the input signals $V_C$ and $V_F$ are not applied or are not at their up levels, the tunnel diode 11G of stage 10G will be operating at its low voltage state due to the presence of the biasing voltage $V_G$. The application of the drive signal $V_D$ will not cause the tunnel diodes 11C and 11F to switch due to the absence of the input signals $V_C$ and $V_F$ and a positive pulse is not evidenced in the output signal $V_O$.

If either input signal ($V_C$ or $V_F$) is at the up level when the drive signal $V_D$ is applied, the tunnel diode of the stage associated with applied input signal will switch. This causes the tunnel diode 11G of stage 10G to switch and results in a change in the level of the output signal $V_O$. The outputs of the stages 10C and 10F are connected with the node 13G of the stage 10G whereby the tunnel diode 11G will switch to change the output signal $V_O$ when the drive signal is propagated through either or both of the stages 10C or 10F.

The circuit shown in FIGURE 7 of the drawings is adapted to perform Boolean addition in that the output signal $V_O$ is affected by the presence of any of the input signals. The tunnel diodes 11C, 11F and 11G are shown as biased for operation in the bistable mode and it is necessary to remove the input signals and the bias voltage to reset the tunnel diodes. However, the tunnel diodes may be biased for operation in the monostable mode by proper selection of circuit parameters as described in connection with the embodiment shown in FIGURES 3–6.

Figure 8:
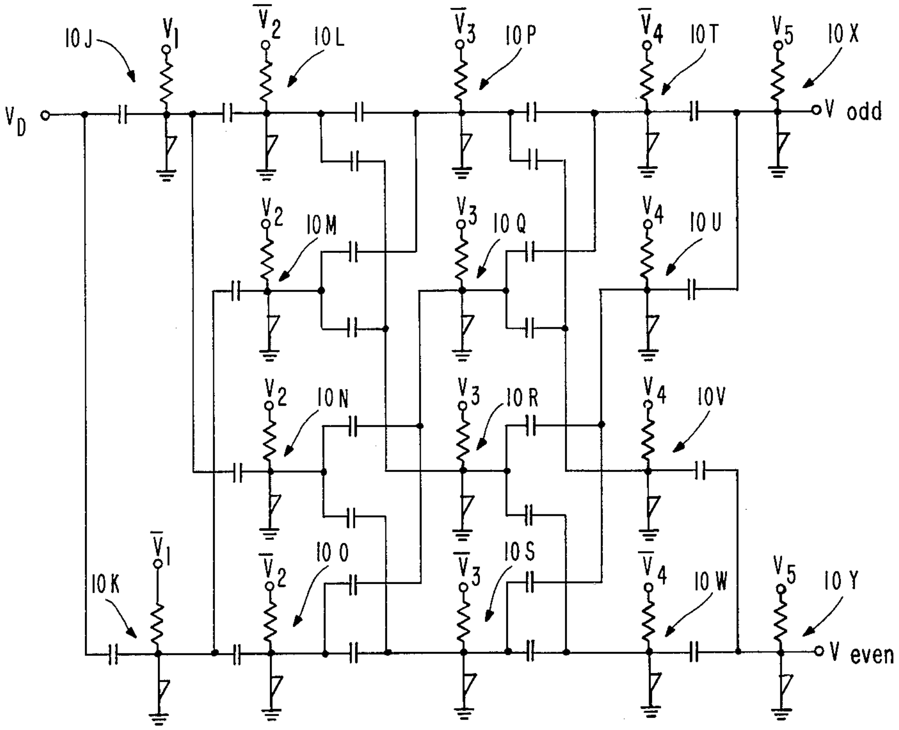
FIGURE 8 is a schematic circuit diagram of a logic circuit embodying the logical And and Or circuits of FIGURES 1 and 7 for indicating the presence of an odd or even number of a number of input signals.

Referring now to FIGURE 8 of the drawings, there is disclosed a logic circuit capable of indicating whether an odd or an even number of a number of input signals are being applied at the same time. In the present instance the circuit is designed for use with four input signals, $V_1$, $V_2$, $V_3$ and $V_4$. The inverse of the input signals $V_1$, $V_2$, $V_3$ and $V_4$ are also available and are designated by the symbols $\overline{V_1}$, $\overline{V_2}$, $\overline{V_3}$ and $\overline{V_4}$. The arrangement is such that whenever a particular input signal ($V_2$, for example) is at a positive level, the inverse input signal ($\overline{V_2}$, for example) will be at the down level and vice-versa.

This logic circuit comprises the individual stages 10J–10Y and each of the stages 10J–10W is similar to the stages of the logic circuit shown in FIGURES 1 and 3 of the drawings in that the input terminal thereof is connected to an input signal. For example, the input signal $V_1$ is associated with stage 10J, input signal $\overline{V_1}$ is associated with stage 10K, input signal $\overline{V_2}$ is associated with stage 10L, etc. The input terminals of the stages 10X and 10Y are coupled to a positive terminal of a direct current voltage source $V_5$ which is always at the positive or up level during a logical operation. The tunnel diodes of the stages 10X and 10Y are initially biased to their low voltage operating points or states by the voltage $V_5$. The drive signal $V_D$ is coupled through a pair of capacitors to the nodes of the stages 10J and 10K. Each of the stages 10J–10S has its node coupled with the nodes of two adjacent stages. For example, the node of stage 10J is coupled to the nodes of stages 10L and 10N, the node of stage 10L is coupled to the nodes of stages 10P and 10R, etc. The nodes of the stages 10T and 10U are connected to the node of the stage 10X while the output of the stages 10V and 10W are coupled to the node of the stage 10Y. A positive pulse in the output of stage 10X signifies that an odd number of the input signals $V_1$–$V_4$ has been applied while a positive voltage change in the output of the stage 10Y indicates that an even number of the input signals are present.

The logic circuit of FIGURE 8 is symmetrical in the sense that the output signal from any stage associated with a particular input signal other than the last input signal ($V_4$) is coupled to the stages associated with the normal and inverse functions of another input signal. For example, the output of stage 10J which is associated with the input signal $V_1$, drives the stages 10L and 10N associated with the input signals $\overline{V_2}$ and $V_2$, respectively. The pairs of the stages 10T–10U and 10V–10W have their outputs coupled to the stages 10X and 10Y. Each of these pairs has a stage responsive to the input signal $V_4$ and a stage responsive to the inverse input signal $\overline{V_4}$.

The operation of this logic circuit will perhaps best be understood by considering specific examples of its use. As a first example, it will be assumed that only the $V_1$ input signal is applied or at the positive level at the time the drive signal $V_D$ is applied. The tunnel diodes associated with the stages 10J, 10L, 10P, 10T and 10X will switch in rapid succession to provide a pulse in the output signal $V_{odd}$. The stages 10L, 10P and 10T will switch since the inverse input signals $\overline{V_2}$, $\overline{V_3}$ and $\overline{V_4}$ are at positive levels at this time. The tunnel diode of stage 10Y will not switch since any possible circuit path leading thereto can be traced through a stage which does not receive an input signal and/or the propagated drive signal necessary to raise the operating point of the tunnel diode associated therewith above the peak on its characteristic curve.

When the signals $V_3$ and $V_4$ are at a positive level at the time the drive signal $V_D$ is applied, the tunnel diodes of stages 10K, 10O, 10Q, 10V and 10Y switch in succession through their negative resistance regions to provide a change in the output signal $V_{even}$. The circuit path through the various stages can be traced for any and all combinations of the input signals $V_1$–$V_4$ in the manner above described. The arrangement is such that the application of an odd number of such input signals during the time that the drive pulse $V_D$ is applied will result in a change in the output signal $V_{odd}$ while any even combination of the input signals under similar circumstances will provide a change in the output signal $V_{even}$.

The tunnel diodes in the logic circuit in FIGURE 8 are shown to be biased for operation in the bistable mode wherein the input and biasing signals are removed between successive logic operations. It should be apparent that the tunnel diodes may be operated in the monostable mode to provide automatic resetting. This circuit may be expanded or contracted according to the symmetrical relations disclosed to handle any number of input signals. A logic circuit of this type capable of receiving ten input signals would involve nine sections of four stages each with each section being associated with one of the input signals. The output of each stage in any intermediate section would be coupled with two stages of an adjacent section while the output of the stages in the last section would be combined in a pair of output stages performing the logical Or function to provide the odd or even indication.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A logic circuit for performing Boolean multiplication on a plurality of input signals comprising a stage for each of said input signals, each of these stages having a tunnel diode characterized by a negative resistance region in its characteristic curve, a bias resistor connected in series with said tunnel diode so as to bias said tunnel diode to have one stable state, means to apply one of said input signals to the end terminal of said bias resistor, a node disposed between said bias resistor and said tunnel diode, means interconnecting the node of each stage with the node of the adjacent stage, said means interconnecting comprising a capacitor, means to couple a drive signal to the node of the first stage, means to couple an output signal to the node of the last stage, each of said tunnel diodes operating at its stable state when only the input signal associated therewith is supplied thereto, and each of said tunnel diodes switching from its stable state through its negative resistance region when all input signals and drive signals are applied, means to automatically reset said tunnel diodes to their stable states, said means to reset comprising an inductor connected in series with said bias resistor and said tunnel diode of each of said stages, and the inductance of each inductor being larger than the inductance of the circuit path defined by the tunnel diode of the adjacent succeeding stage.

2. A logic circuit for combining a plurality of input signals comprising a stage for each of said input signals, each of the stages comprising a device having at least a pair of terminals, said device having a pair of positive resistance regions separated by a negative resistance region in its characteristic curve, said characteristic curve defining a peak and a valley at opposite ends of said negative resistance region, a bias element connected in series with said device so as to bias said device to have one stable state, means to apply one of said input signals to the end terminal of said bias element, a node disposed between said bias element and said device, means interconnecting the node of each stage with the node of an adjacent stage, means to couple a drive signal to the node of at least one of said stages, means connected to at least one of said stages to serve as an output for the logic circuit, each of said devices being in its stable state when only the input signal associated therewith is supplied thereto, and each of said devices switching from its stable state through its negative resistance region when the drive and input signals associated therewith are applied simultaneously thereto, means to reset said devices to their stable states, said means to reset comprising an inductor connected in series with said bias element and said device for each of said stages, and the inductance of each inductor being larger than the inductance of the circuit path defined by the device of the adjacent succeeding stage.

3. A logic circuit for combining input signals comprising a plurality of stages, each of said stages comprising a device having at least a pair of positive resistance regions separated by a negative resistance region in its characteristic curve, a bias element connected in series with said device, a node disposed between said bias element and said device, means interconnecting the node of each stage with the node of at least one adjacent stage, said logic circuit having a pair of input stages, at least one intermediate section and a pair of output stages, each of said intermediate sections having four stages, means coupling a drive signal to the nodes of said input stages, means coupling an input signal and the inverse thereof to the end terminals of the bias elements of said input stages, an input signal associated with each of said intermediate sections, means coupling said last-mentioned input signal and the inverse thereof to the end terminals of the bias elements of pairs of said stages in the intermediate section associated therewith, means supplying a reference signal to the end terminals of the bias elements of said output stages, means for supplying a pair of output signals connected with the nodes of said output stages, a change in one of said output signals indicating the application of an odd number of said input signals and said drive signal, and a change in the other of said output signals indicating the application of an even number of said input signals and said drive signal.

References Cited by the Examiner

UNITED STATES PATENTS

| | | | |
|---|---|---|---|
| 3,078,376 | 2/63 | Lewin | 307—88.5 |
| 3,103,600 | 9/63 | Lewin | 307—88.5 |

OTHER REFERENCES

"Tunnel Diode Logic Circuits," by Chow; Electronics, June 24, 1960.

Report No. 102, Applications of Tunnel Diodes in Switching Circuits, by Toshiro Kunihiro, Univ. of Ill. Grad. School Dig. Compt. Lab., Oct. 26, 1960.

I.B.M. Tech. Bulletin, vol. 3, No. 9, February 1961.

Tunnel Diode Circuit Design Handbook, Transition Corp., Mass., March 1961.

Proceedings of the Eastern Joint Computer Conf. "Negative-Resistance Elements as Digital Computer Components," by Lewin, pages 15–27 relied on.

ARTHUR GAUSS, *Primary Examiner.*

HERMAN KARL SAALBACH, *Examiner.*